(12) United States Patent
Kuo

(10) Patent No.: US 7,773,416 B2
(45) Date of Patent: Aug. 10, 2010

(54) SINGLE POLY, MULTI-BIT NON-VOLATILE MEMORY DEVICE AND METHODS FOR OPERATING THE SAME

(75) Inventor: Ming-Chang Kuo, Changhua County (TW)

(73) Assignee: Macronix International Co., Ltd. (TW)

( * ) Notice: Subject to any disclaimer, the term of this patent is extended or adjusted under 35 U.S.C. 154(b) by 262 days.

(21) Appl. No.: 11/420,701

(22) Filed: May 26, 2006

(65) Prior Publication Data

US 2007/0274130 A1 Nov. 29, 2007

(51) Int. Cl.
*G11C 16/04* (2006.01)

(52) U.S. Cl. .............................. 365/185.03; 365/185.05; 257/314

(58) Field of Classification Search ............ 365/185.05, 365/185.03; 257/314
See application file for complete search history.

(56) References Cited

U.S. PATENT DOCUMENTS

| | | | | |
|---|---|---|---|---|
| 4,658,380 A | * | 4/1987 | Eby | 365/201 |
| 5,159,570 A | * | 10/1992 | Mitchell et al. | 365/185.03 |
| 5,714,412 A | * | 2/1998 | Liang et al. | 438/266 |
| 5,760,435 A | * | 6/1998 | Pan | 257/314 |
| 5,949,711 A | * | 9/1999 | Kazerounian | 365/185.05 |
| 5,958,795 A | * | 9/1999 | Chen et al. | 438/692 |
| 6,258,668 B1 | * | 7/2001 | Lee et al. | 438/262 |
| 6,521,942 B2 | * | 2/2003 | Borel et al. | 257/316 |
| 6,620,683 B1 | * | 9/2003 | Lin et al. | 438/257 |
| 6,737,700 B1 | * | 5/2004 | Chang et al. | 257/315 |
| 6,917,070 B2 | | 7/2005 | Hung et al. | |
| 7,259,984 B2 | | 8/2007 | Kan et al. | |

OTHER PUBLICATIONS

Kung-Hong Lee, et al., "New Single-poly EEPROM with Cell Size Down to 8F2 for High Density Embedded Nonvolatile Memory Applications", 2003 Symposium on VLSI Technology Digest of Technical Papers.
Kynett, et al., "An In-System Reprogrammable 256K CMOS Flash Memory," IEEE, Feb. 18, 1988, pp. 132, 133, 330, International Solid-State Circuits Conference.

* cited by examiner

*Primary Examiner*—J. H. Hur
(74) *Attorney, Agent, or Firm*—Baker & McKenzie LLP

(57) ABSTRACT

A non-volatile memory device comprises a substrate with a dielectric layer formed thereon. A control gate is formed on the dielectric layer, as are two floating gates, one on either side of the control gate. Accordingly, the non-volatile memory device can be constructed using a single poly process that is compatible with conventional CMOS processes. In addition, the device can store two bits of data, one in each floating gate. The device can comprises two diffusion regions formed in the substrate, one near each floating gate, or four diffusion regions, one near each edge of each floating gate.

29 Claims, 22 Drawing Sheets

SINGLE POLY, MULTI-BIT NON-VOLATILE MEMORY DEVICE AND METHODS FOR OPERATING THE SAME

BACKGROUND

1. Field of the Invention

The embodiments described herein are directed to non-volatile memory devices, and more particularly to a non-volatile memory device comprising a single polysilicon gate layer that is compatible with CMOS processing techniques.

2. Background of the Invention

Many non-volatile semiconductor memories are based on the well known MOS-type structure. In other words, they comprise a gate structure separated from a substrate by a dielectric layer. Diffusion regions are implanted in the substrate under the corners of the gate structure. When the appropriate voltages are applied to the diffusion regions and the control gate, a channel can be created in the upper layers of the substrate between the diffusion regions and under the gate structure. Carriers, e.g., electrons, can travel the channel between the diffusion regions.

If a sufficient field component is present in the direction of the gate structure, the carriers, e.g., electrons, can be attracted to the gate structure. If the electrons have enough energy to overcome the barrier height of the dielectric layer, then these carriers can be injected through the dielectric layer.

For example, FIG. 1 is a diagram illustrating a conventional floating gate memory device 100. It will be understood that such a floating gate device can be the basic memory structure of a conventional flash memory device. Floating gate device 100 comprises substrate 102 into which diffusion region 104 and 106 have been implanted. In the example of FIG. 1, device 100 is an NMOS device, meaning that substrate 102 is a P-type substrate while diffusion regions 104 and 106 are N+-type diffusion regions. It will be understood that certain memory devices can also make use of PMOS structures in which substrate 102 is an N-type substrate and diffusion regions 104 and 106 are P+-type diffusion regions.

A dielectric layer 110 is then formed over the substrate between diffusion regions 104 and 106. This dielectric layer is often a silicon dioxide ($SiO_2$) dielectric layer and can be referred to as the tunnel oxide layer. A floating gate 112 is formed on top of dielectric layer 110. Floating gate 112 is typically formed from a polysilicon layer that is deposited on top of substrate 102 and etched to the appropriate dimensions. An inter-dielectric layer 114 is then formed over floating gate 112, and a control gate 116 is then formed on inter-dielectric layer 114. As with floating gate 112, control gate 116 is typically formed from a polysilicon layer that is etched to the appropriate dimensions.

When the appropriate voltages are applied to control gate 116 and diffusion regions 104 and 106, a channel can be formed in channel region 108 of substrate 102. The voltage applied to control gate 116 will couple with floating gate 112 to create the field component necessary to attract carriers in channel region 108 to floating gate 112. It will be understood, that the coupling between control gate 116 and floating gate 112 is dependent on the voltage applied to control gate 116 as well as the dimensions associated with control gate 116, inter-dielectric layer 114, and floating gate 112.

It will further be understood that density and cost are important driving factors in non-volatile semiconductor memory technology. The ever-expanding uses for non-volatile semiconductor memories require such memories to be mass-producible at low cost. Further, the requirements of new applications for non-volatile semiconductor memories require increased capacity, and a decreased footprint.

Device 100 of FIG. 1 presents several problems in this regard. First, because both floating gate 112 and control gate 116 are formed from polysilicon layers, device 100 is fabricated using what is termed a double poly process. This makes fabrication of device 100 incompatible with conventional CMOS techniques, which are single poly processes. As a result, special processes are required in order to fabricate device 100. Second, device 100 is only capable of storing one bit of data, which limits the densities that can be achieved using device 100.

SUMMARY

A non-volatile memory device comprises a substrate with a dielectric layer formed thereon. A control gate is formed on the dielectric layer, as are two floating gates, one on either side of the control gate. Accordingly, the non-volatile memory device can be constructed using a single poly process that is compatible with conventional CMOS processes. In addition, the device can store two bits of data, one in each floating gate.

In one aspect, the device comprises two diffusion regions formed in the substrate, one near each floating gate.

In another aspect, the device can comprise four diffusion regions, one near each edge of each floating gate.

In still another aspect, coupling between the control gate and the diffusion regions with the floating gates is used to form a channel in the substrate in order to enable device operation.

In still another aspect, channel hot electron techniques can be used to program the device.

In still another aspect, UV radiation can be used to erase the device.

In still another aspect, Band-To-Band-Hot-Hole Injection can be used to erase the device.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION

The embodiments described below are directed to a non-volatile memory devices comprising a substrate with a dielectric layer formed thereon. A control gate is formed on the dielectric layer and then two floating gates are disposed on either side of the control gate on the dielectric layer. Diffusion regions are formed in the substrate. Voltages applied to the control gate and with the diffusion regions can couple with the floating gates in order to form a channel region in the substrate and provide the field necessary to cause some of the carriers in the channel region to penetrate the dielectric layer into the floating gate.

It will be understood that any dimensions, measurements, ranges, test results, numerical data, etc., are approximate in nature and unless otherwise stated not intended as precise data. The nature of the approximation involved will depend on the nature of the data, the context and the specific embodiments or implementations being discussed.

Figure 1:
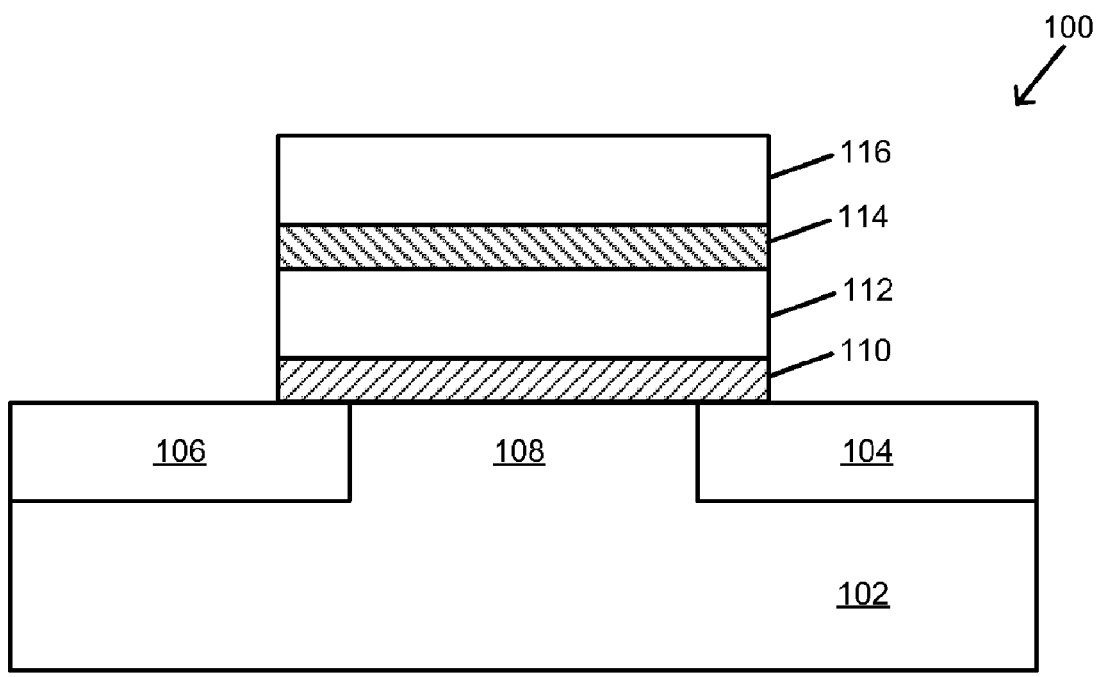
FIG. 1 is a diagram illustrating a conventional floating gate memory device.
Figure 2:
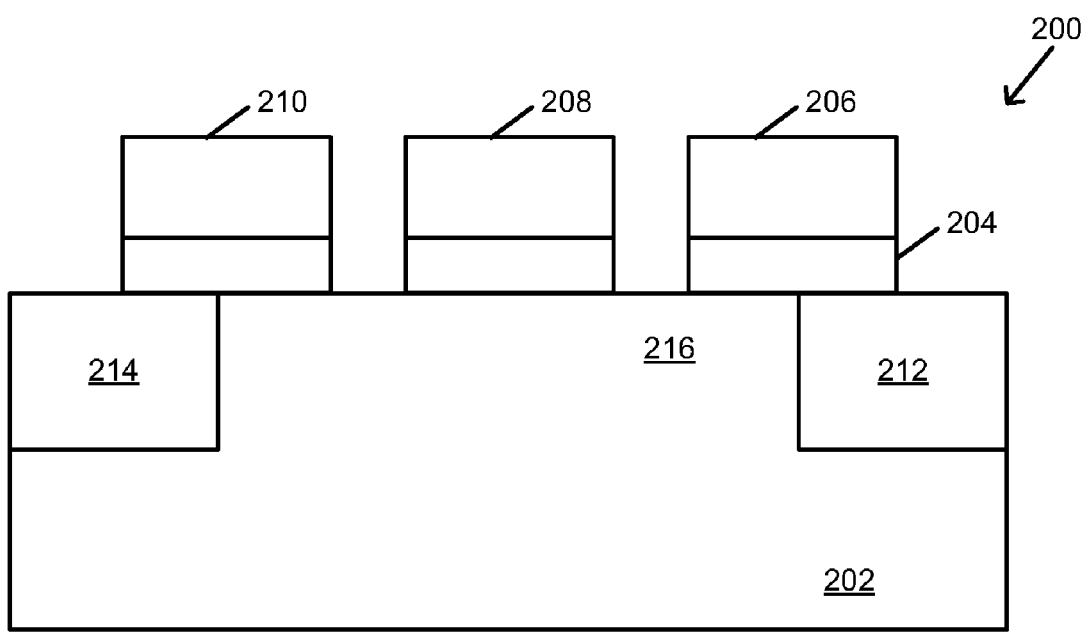
FIG. 2 is a diagram illustrating a non-volatile memory device configured in accordance with one embodiment.

FIG. 2 is a diagram illustrating a non-volatile memory device configured in accordance with one embodiment as described herein. Device 200 comprises a substrate 202 with diffusion regions 212 and 214 formed therein. In the example of FIG. 2, substrate 202 is a P-type substrate and diffusion regions 212 and 214 are N+ type diffusion regions. Accordingly, device 200 is an NMOS device. It would be understood, however, that in other embodiments device 200 can be a PMOS device comprising an N-type substrate with P+ type diffusion regions.

A dielectric layer 204 is then formed over substrate 202. Floating gate structures 206 and 210, as well as control gate structure 208, are then formed on dielectric layer 204 using a single polysilicon process step. In other words, floating gate 206, control gate 208, floating gate 210 are formed from a single polysilicon layer that is formed on top of dielectric layer 204. The polysilicon layer and dielectric layer 204 are then etched using conventional photolithography techniques to form the gate structures and gate dielectrics illustrated in FIG. 2.

Accordingly, device 200 can be manufactured using a single polysilicon process, which can make it compatible with conventional CMOS processing techniques. Example process steps for manufacturing device 200 are described in more detail below.

Figure 3:
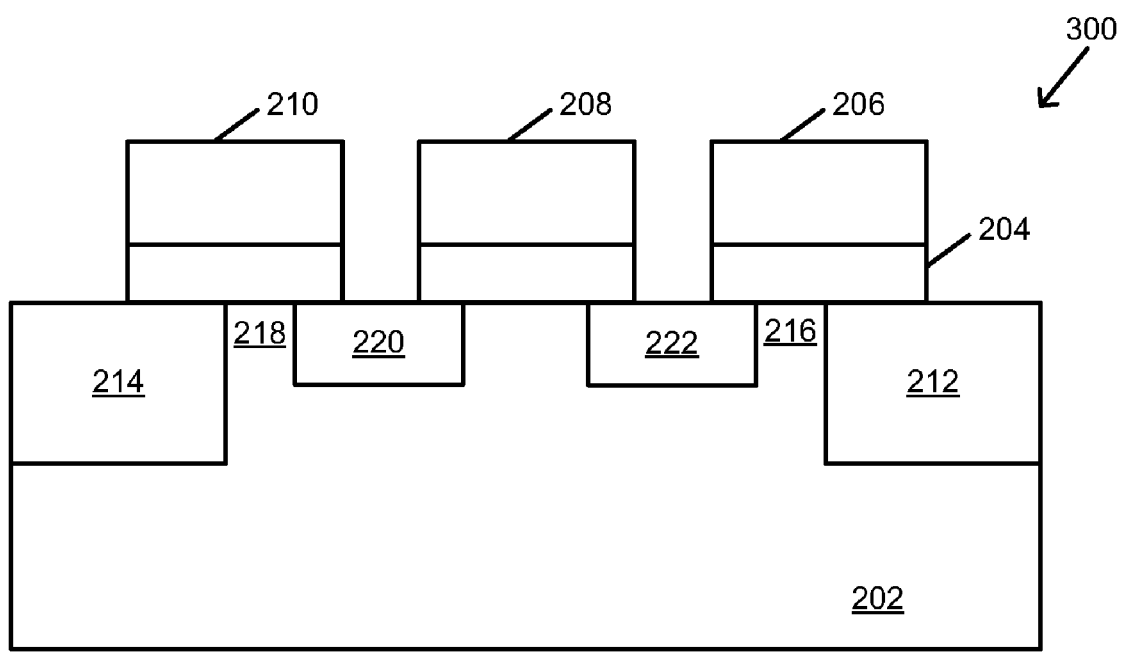
FIG. 3 is a diagram illustrating an example non-volatile memory device configured in accordance with another embodiment.

FIG. 3 is a diagram illustrating an example embodiment of a non-volatile memory device 300 configured in accordance with another embodiment. In the example of FIG. 3, device 300 comprises additional diffusion regions 220 and 222. Differences in the operation of devices 200 and 300 will be described in detail below. Additionally, differences in the process steps for manufacturing devices 200 and 300 will also be described in detail below.

Referring to FIG. 2, each of floating gates 206 and 210 can be configured to store charge representative of a bit of information, i.e., a logic "1" or "0". Accordingly, device 200 is configured for multi-bit operation, which can increase density, reduce device size, decrease manufacturing time, and/or lower costs.

Voltage applied to control gate 208 can couple with each of floating gates 206 and 210 in order to aid in the programming, erasing and reading of floating gates 206 and 210. Thus, for example, in order to program floating gate 206, voltages applied to control gate 208 are coupled with floating gate 206 in order to create a channel region 216 in substrate 202 under floating gate 206. The voltage coupled with floating gate 206 can also provide the field necessary to induce carriers in channel region 216 to penetrate dielectric layer 204 into floating gate 206. Similarly, voltages applied to control gate 208 can be coupled with floating gate 210 in order to enable programming, erasing and reading of the bit stored in floating gate 210.

Figure 4:
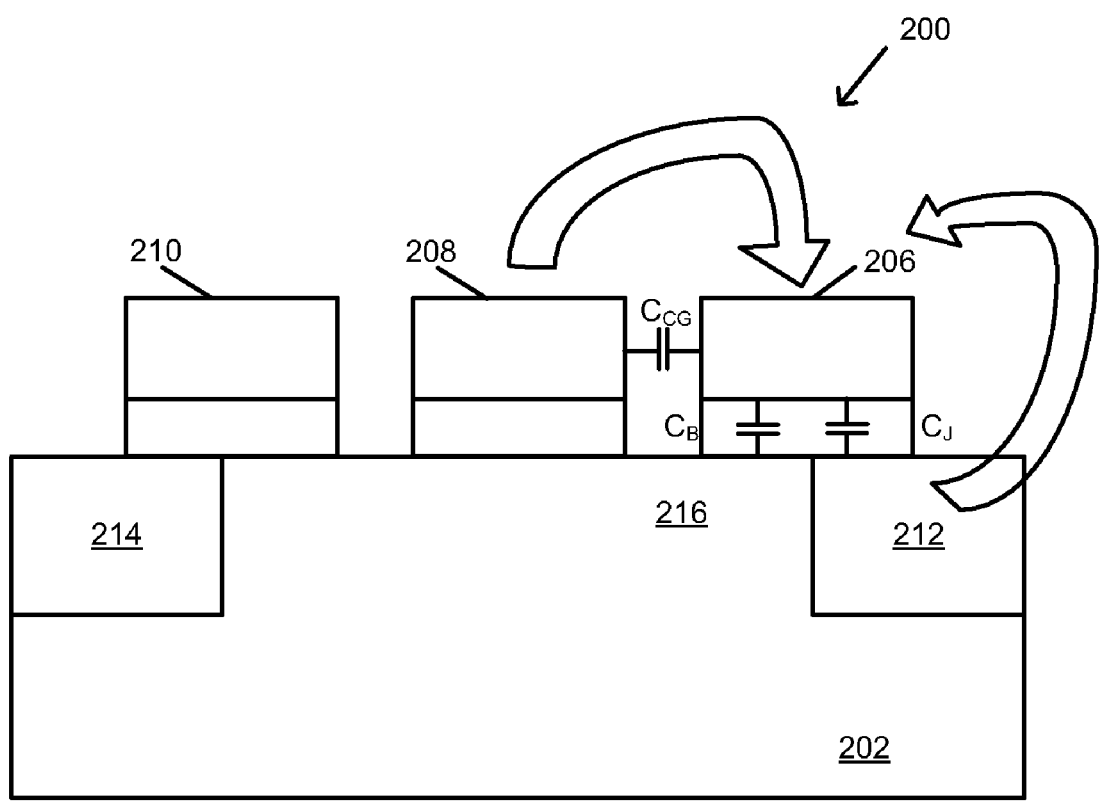
FIG. 4 is a diagram illustrating coupling with the floating gate for the device of FIG. 2.
Figure 5:
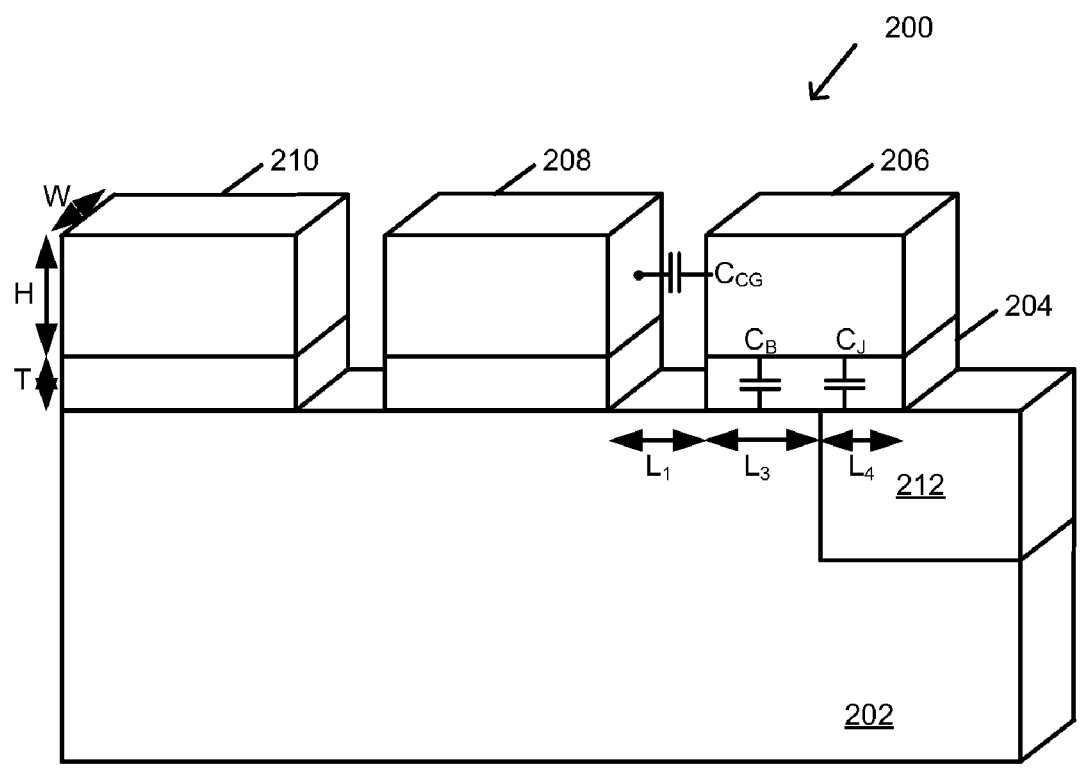
FIG. 5 is a diagram illustrating example dimensions for the device of FIG. 2.

This coupling can be illustrated with the aid of FIGS. 4 and 5. FIG. 4 is a diagram illustrating the capacitance formed between the various gates and layers of device 200 with respect to floating gate 206. It will be understood that the coupling mechanisms are the same for floating gate 210. Accordingly, a description of the coupling for floating gate 210 will be omitted for the sake of brevity. Similarly, it will be understood that the coupling mechanisms for device 300 are the same as for device 200. Accordingly, a description of the coupling for device 300 will be omitted for the sake of brevity.

As can be seen in FIG. 4, when a voltage is applied to control gate 208 the voltage can be coupled to floating gate 206 via control gate capacitance ($C_{CG}$). Floating gate 206 is then coupled with substrate 202 via bulk capacitance ($C_B$). In addition, floating gate 206 can be coupled with diffusion region 212 via junction capacitance ($C_J$), when a voltage is applied to diffusion region 212. It is the capacitive coupling mechanisms that create the field necessary to cause carriers in channel region 216 to penetrate dielectric layer 204 into floating gate 206.

FIG. 5 is a diagram illustrating example dimensions associated with device 200 in accordance with one particular implementation. These dimensions can be used to illustrate the coupling that can be produced for device 200. First, the control gate capacitance ($C_{CG}$), junction capacitance ($C_J$) and bulk capacitance ($C_B$) are given by the following equations:

$$C_G = \in (H*W)/L1 \quad (1)$$

$$C_B = \in (L3*W)/T \quad (2)$$

$$CJ = \in (L4*W)/T \quad (3)$$

Where, $\in$=dielectric constant; and
W=the width of the gate into the page.
H=the height of the gate
L1=the spacer length between the gates.
L3=the length of the portion of the dielectric layer under floating gate, excluding L4
L4=the length of the dielectric layer under the floating gate and above the diffusion region
T=the thickness of dielectric layer Thus, the control gate capacitance ($C_{CG}$) is equal to $\in$ multiplied by the height of control gate 208, multiplied by the width of control gate 208, and then divided by the spacing between control gate 208 and floating gate 206. The bulk capacitance ($C_B$) is equal to $\in$ multiplied by the length of dielectric layer 204 under floating gate 206, excluding the portion that overlaps with diffusion region 212, multiplied by the width of floating gate 206, and then divided by the height of dielectric layer 204. The junction capacitance ($C_J$) is equal to $\in$ multiplied by the length of dielectric layer 204 under floating gate 206 and over diffusion region 212, multiplied by the width of floating gate 206, then divided by the thickness of dielectric layer 204.

The total capacitance is then given by the following equation:

$$C_{TOT} = C_J + C_{CG} + C_B \quad (4)$$

The coupling ratio between control gate 208 and floating gate 206 is then given by the following equation;

$$\alpha_{CG} = C_{CG}/C_{TOT} \quad (5)$$

The coupling ratio between diffusion region 212 and floating gate 206 is then given by the following equation:

$$\alpha_J = C_J/C_{TOT} \quad (6)$$

Accordingly, the voltage on floating gate 206 can be given by the following equation;

$$V_{FG} = (V_{CG}*\alpha_{CG}) + (V_N*\alpha_J) \quad (7)$$

Where, $V_{CG}$=the control gate voltage, and
$V_N$=the diffusion region voltage.

For example, in one embodiment a non-volatile memory device configured in accordance with the systems and methods described herein can comprise the following dimensions;
H=1000 Å;
L1=200 Å;
L3=400 Å;
L4=200 Å; and
T=100 Å.

Thus, the total capacitance is then given by equation (4):

$$C_{TOT} = C_J + C_{CG} + C_B = \in 11W$$

The coupling ratio between control gate 208 and floating gate 206 is then given by equation (5):

$$\alpha_{CG} = C_{CG}/C_{TOT} = \in 5W/\in 11W = 5/11$$

The coupling ratio between diffusion region 212 and floating gate 206 is then given by equation (6):

$$\alpha_J = C_J/C_{TOT} = \in 2W/\in 11W = 2/11$$

The voltage on floating gate 206 can be given by equation:

$$V_{FG} = V_{CG}*\alpha_{CG} + V_N*\alpha_J$$
$$= 5/11 V_{CG} + 2/11 V_N$$

It will be understood that the dimensions described above can vary depending on the requirements of a specific invention; however, it will be clear that sufficient coupling must be achieved regardless of the dimensions used. Accordingly, the actual dimension for a given implementation must be sufficient to provide the required coupling.

In certain other embodiments, for example, the dimensions described above can have values in the following approximate ranges:
H=800-1500 Å;
L1=160-300 Å;
L3=300-500 Å
L4=160-300 Å; and
T=50-250 Å.

Figure 6:
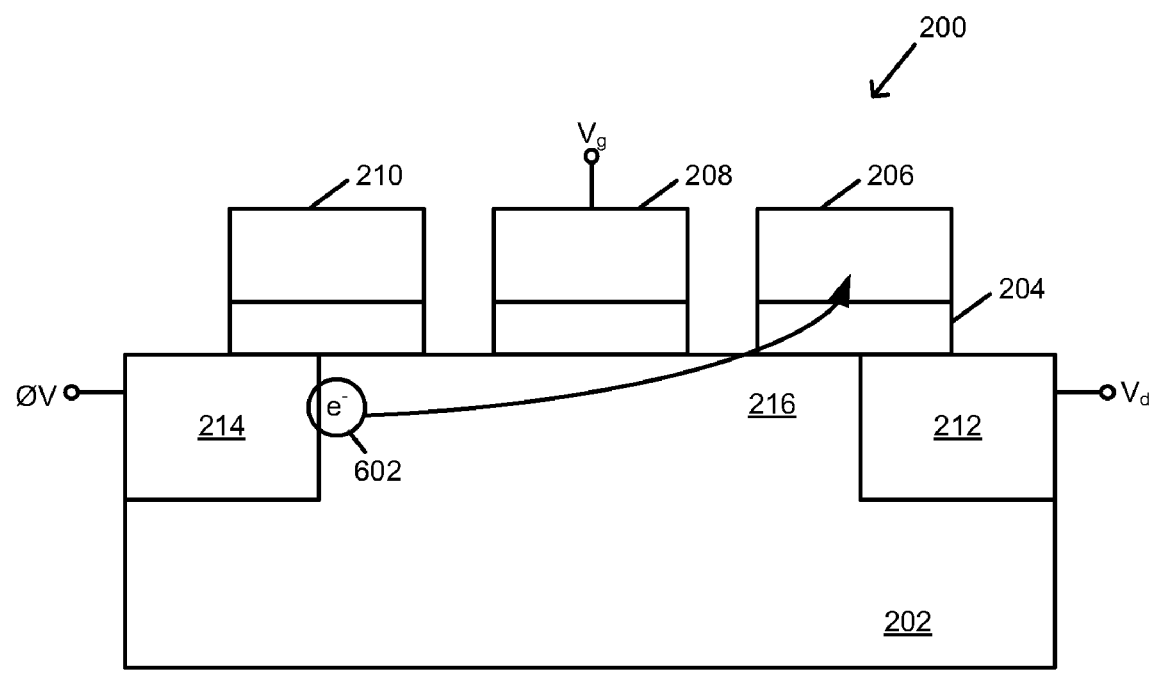
FIG. 6 is a diagram illustrating an example method for programming a first bit of the device of FIG. 2 in accordance with one embodiment.

FIG. 6 is a diagram illustrating an example program operation for floating gate 206 of device 200 in accordance with one embodiment. First, a high voltage can be applied to control gate 208, which will be coupled, as described above, with floating gate 206. Voltages can also be applied to diffusion regions 212 and 214 in order to create a large lateral electric field across the channel region. In this case, a low voltage is applied to diffusion region 214, which can act as the source region, while a high voltage is applied to diffusion region 212, which can act as the drain region. The high voltage applied to diffusion region 212 is also coupled with floating gate 206 as described above.

The high voltages coupled with floating gate 206 must be sufficient to allow an inversion channel region 216 to form under floating gate 206 into which carriers, in this case electrons 602, can be induced by the large lateral electric field and caused to flow in channel 216 from diffusion region 214 toward diffusion region 212. The voltage coupled with floating gate 206 must also be sufficient to cause at least some of the carriers 602 to inject through dielectric layer 204 into floating gate 206. The injected carriers will then be stored in floating gate 206, which will change the threshold voltage ($V_T$), and therefore the programming state of floating gate 206.

It will be understood, that carrier 602 must have sufficient energy to overcome the barrier height of dielectric layer 204. For example, if dielectric layer 204 is a silicon dioxide dielectric layer, then carrier 602 must have energy exceeding 3.2 eV in order to overcome the barrier height of the silicon dioxide layer 304. The form of injection illustrated in FIG. 6 is commonly referred to as Channel Hot Electron (CHE) injection.

In the example of FIG. 6, a high voltage of approximately 10V is applied to control gate 208, and a high voltage of approximately 5V is applied to diffusion region 212, while diffusion region 214 is tied to approximately 0V. It will be understood that the voltages illustrated are by way of example only and that the actual voltages will depend on the requirements of the specific implementation. For example, in certain embodiments, the voltage applied to control gate 208 can be in the approximate range of 8-12 V, and the voltage applied to diffusion region 212 can be in the approximate range of 4-6V.

Figure 7:
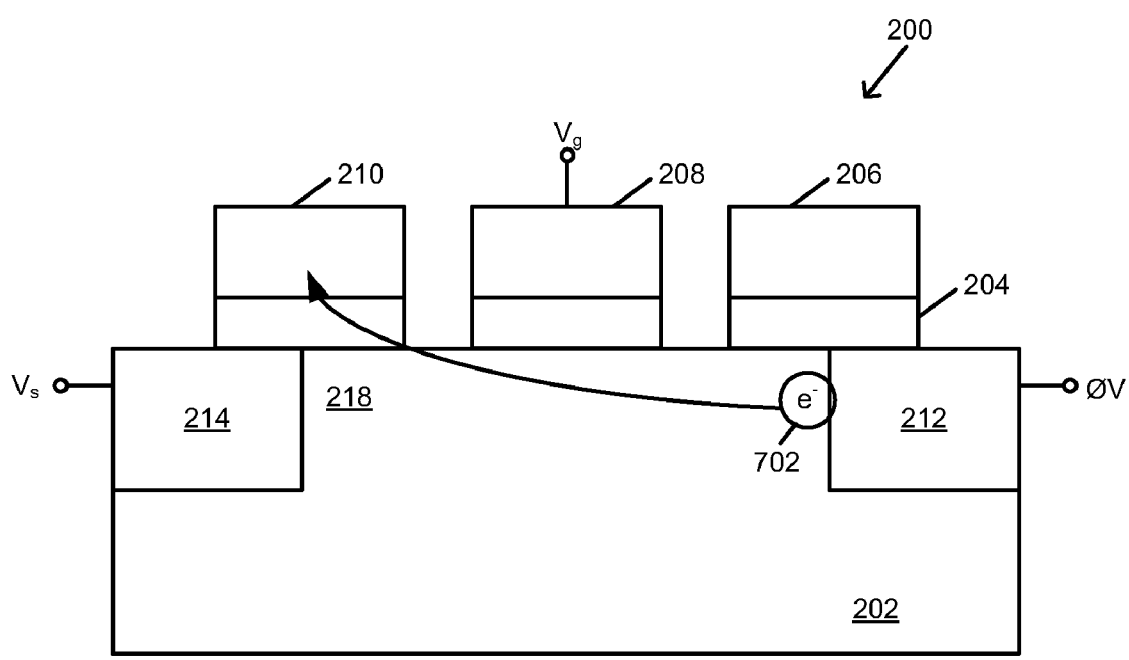
FIG. 7 is a diagram illustrating an example process for programming the second bit of the device of FIG. 2 in accordance with one embodiment.

FIG. 7 is a diagram illustrating an example CHE process for programming floating gate 210 in accordance with one embodiment. Here, the lateral electric field must be reversed so that carriers 702 travel from diffusion region 212 toward diffusion region 214 in channel 218, which is created under floating gate 210 due to coupling of the voltages applied to control gate 208 and diffusion region 214 with floating gate 210. The voltages coupled with floating gate 210 must also be sufficient to cause at least some of carriers 702 to inject through dielectric layer 204 into floating gate 210.

In the example of FIG. 7, a high voltage of approximately 10V is applied to control gate 208, and a high voltage of approximately 5V is applied to diffusion region 212, while diffusion region 214 is tied to approximately 0V. It will be understood that the voltages illustrated are by way of example only and that the actual voltages will depend on the requirements of the specific implementation. For example, in certain embodiments, the voltage applied to control gate 208 can be in the approximate range of 8-12 V, and the voltage applied to diffusion region 212 can be in the approximate range of 4-6V.

It will also be understood that in the processes illustrated in both FIGS. 6 and 7, channels 216 and 218 extend the length of the region of substrate 202 from diffusion region 212 to diffusion region 214. The channels are formed by the voltage applied to control gate 208 and the coupling of this voltage to floating gates 206 and 210.

Figure 8:
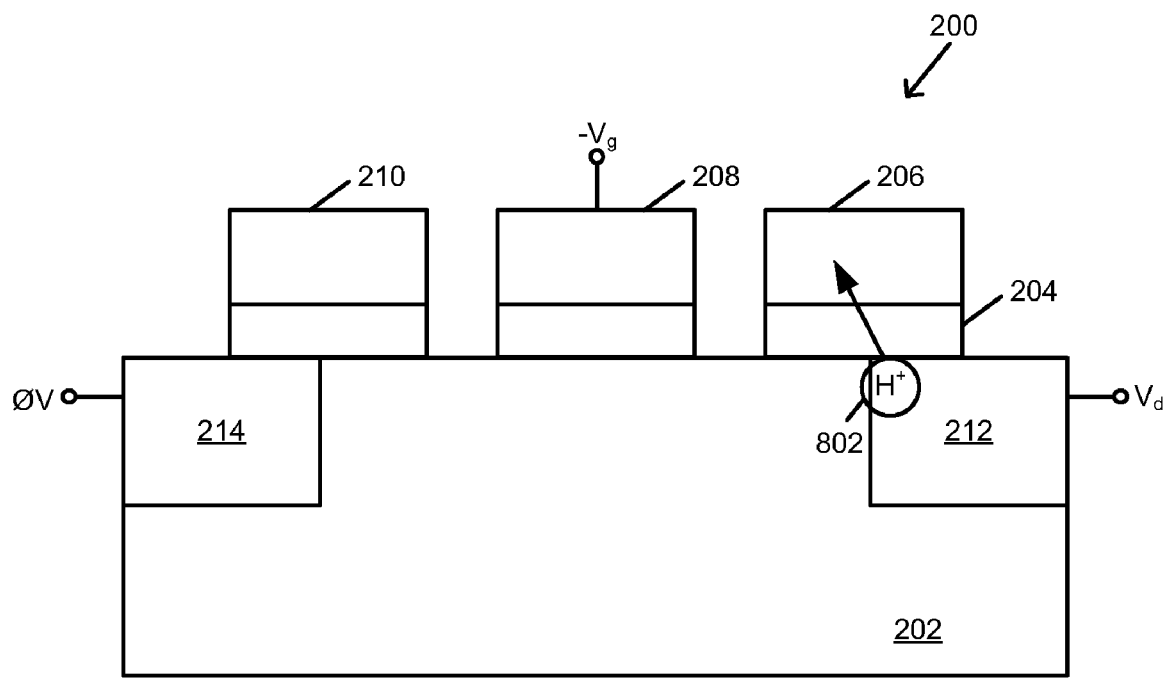
FIG. 8 is a diagram illustrating an example process for erasing the first bit of the device of FIG. 2 in accordance with one embodiment.

FIG. 8 is a diagram illustrating an example method for erasing the first bit of device 200 in accordance with 1 embodiment. In the example, of FIG. 8, Band-To-Band-Hot-Hole (BTBHH) injection is used to erase floating gate 206. BTBHH injection is produced by creating a gate-induced drain leakage (GIDL) current between floating gate 206 and diffusion region 212. GIDL takes place when floating gate 206 is negatively biased and diffusion region 212 is positively biased. Accordingly, as can be seen in FIG. 8, a large negative voltage is applied to control gate 208. The large negative voltage will be coupled with floating gate 206, negatively biasing floating gate 206. A high voltage is then applied to diffusion region 212. Diffusion region 214 is held at a low voltage, i.e., 0 V, to prevent BTBHH erasing of floating gate 210.

Under the conditions illustrated in FIG. 8, a significant portion of N+ diffusion region 212 under floating gate 206 and near channel region 216 will be deleted of electrons. When the electric field across dielectric layer 204 becomes sufficiently large, and the doping concentration of diffusion region 212 is in the appropriate range, e.g., $10^{18}$-$10^{19}$ cm$^{-3}$, holes 802 can tunnel through oxide layer 204 into floating gate 206, where they will compensate for any electrons stored in floating gate 206.

It will be understood that the voltages illustrated in FIG. 8 are by way of example only and that the actual voltages will depend on the requirements of the specific implementation. For example, in certain embodiments, the voltage applied to control gate 208 can be in the approximate range of (-15)-(-25) V, and the voltage applied to diffusion region 212 can be in the approximate range of 4-6V.

Figure 9:
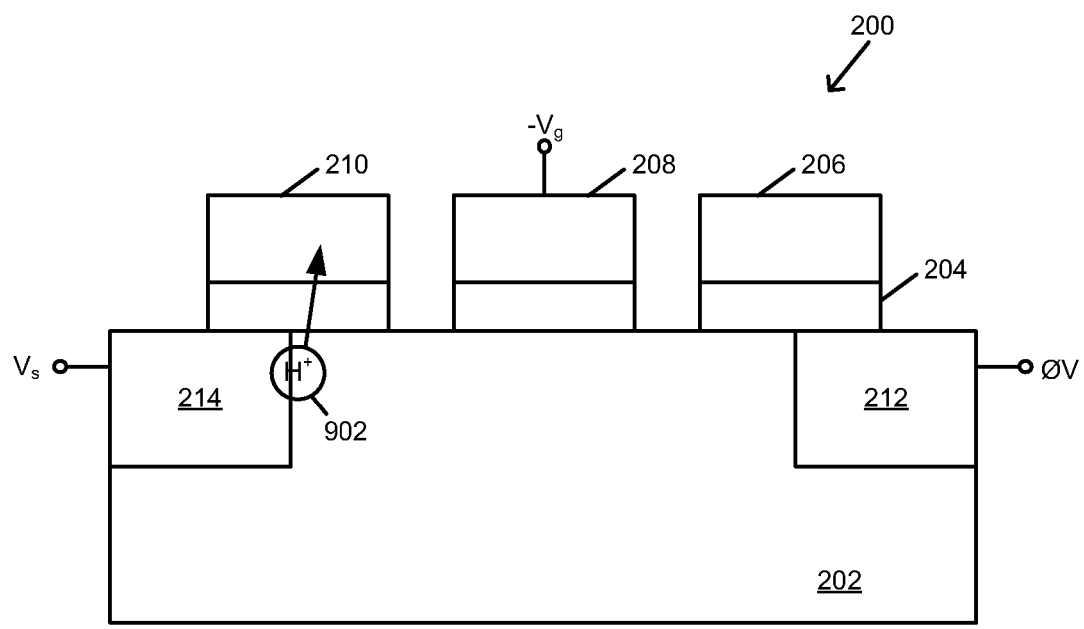
FIG. 9 is a diagram illustrating an example process for erasing the second bit of the device of FIG. 2 in accordance with one embodiment.

FIG. 9 is a diagram illustrating BTBHH process for erasing the second bit of device 200 in accordance with one embodiment. Accordingly, a large negative voltage, e.g., -20V, is applied to control gate 208 in order to negatively bias floating gate 210. In this case, diffusion region 214 is biased with a positive voltage, e.g., 5V, while diffusion region 212 is tied to a low voltage, i.e., 0V, to avoid BTBHH erasure of floating gate 206. The electric field created across dielectric layer 204 by the bias applied to floating gate 210 and diffusion region 214 will deplete a portion of diffusion region 214 of electrons and start BTBHH injection of the resulting minority carriers 902 across dielectric layer 204 into floating gate 210, where they will compensate for electrons previously stored in floating gate 210.

Again it will be understood that the voltages illustrated in FIG. 9 are by way of example only and that the actual voltages will depend on the requirements of the specific implementation. For example, in certain embodiments, the voltage applied to control gate 208 can be in the approximate range of (-15)-(-25) V, and the voltage applied to diffusion region 214 can be in the approximate range of 4-6V.

Figure 10:
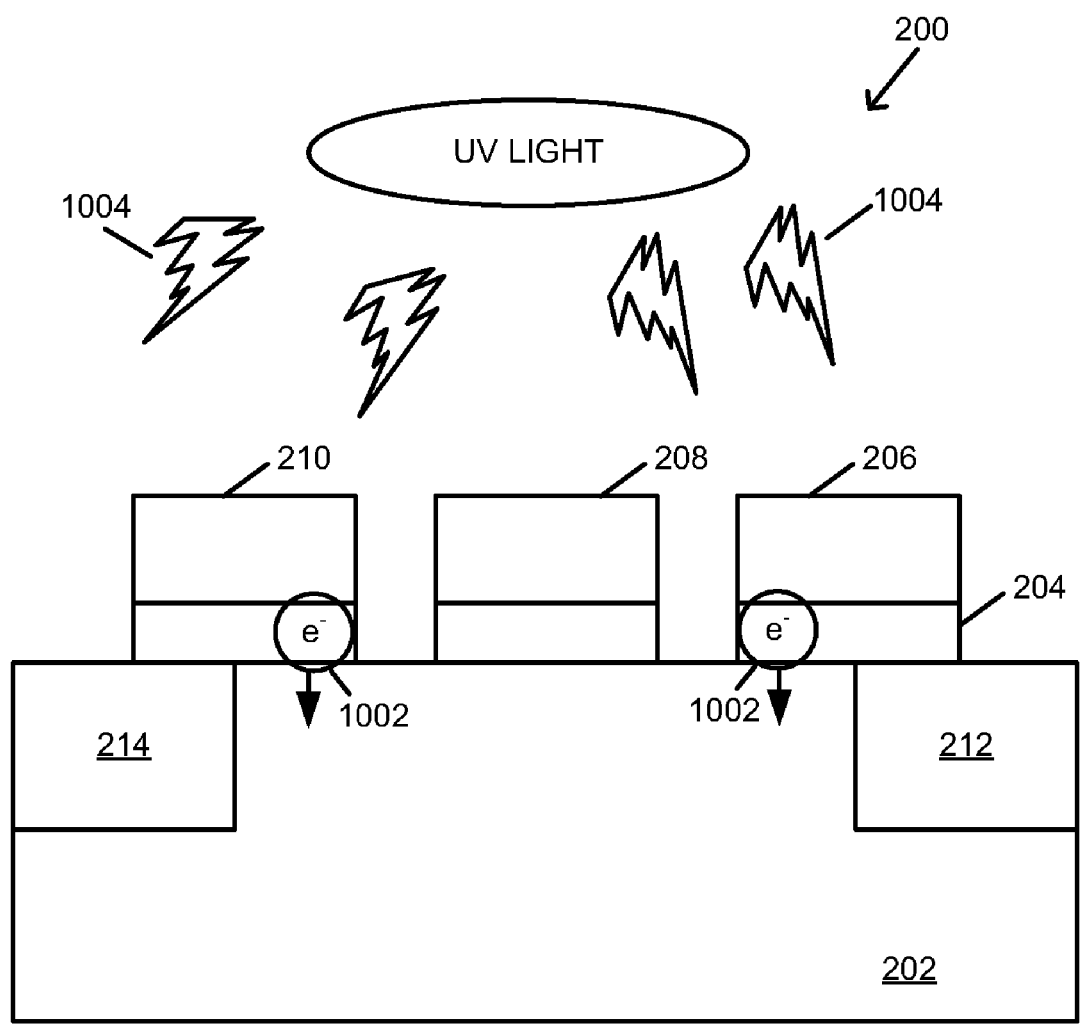
FIG. 10 is a diagram illustrating an example process for erasing both bits of the device of FIG. 2 in accordance with another embodiment.

FIG. 10 is a diagram illustrating an example erase operation for device 200 in accordance with one embodiment. In the example of FIG. 10, ultraviolet (UV) radiation 1004 is incident on device 200. The energy from radiation 1004 will provide electrons 1002 with sufficient energy to penetrate dielectric layer 204 and escape back into substrate 202.

Figure 11:
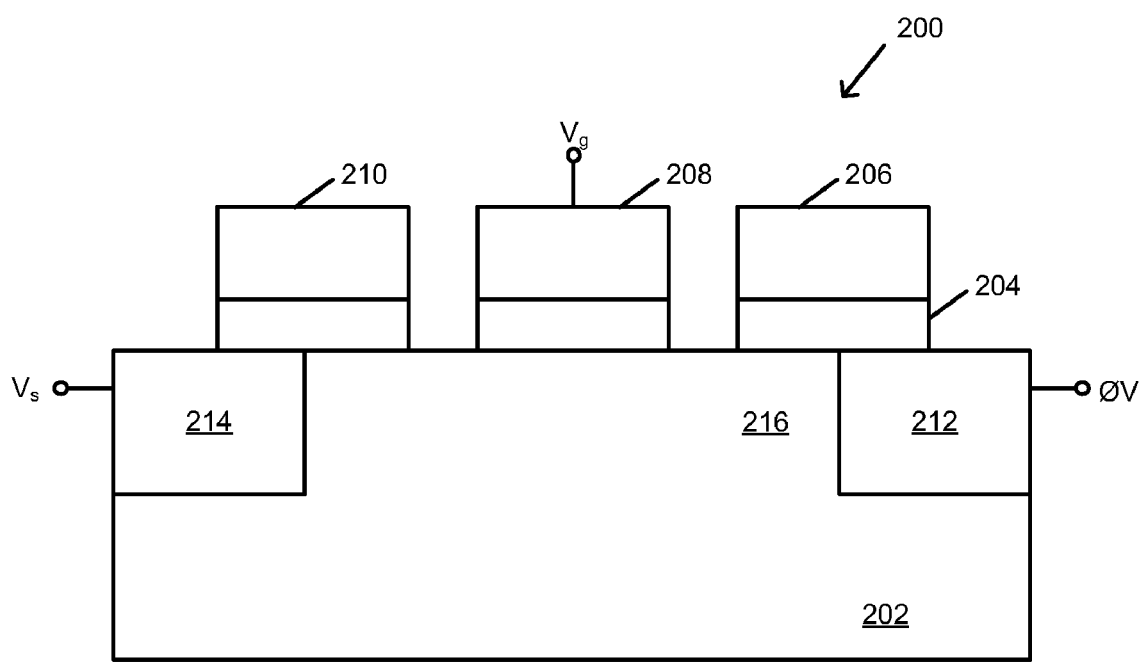
FIG. 11 is a diagram illustrating an example reverse read operation for the first bit of the device of FIG. 2 in accordance with one embodiment.

FIG. 11 is a diagram illustrating an example reverse read operation for reading floating gate 206 of device 200 in accordance with one embodiment. First, a high voltage must be applied to control gate 208. A high voltage can also be applied to diffusion region 214, while a low voltage is applied to diffusion region 212.

In the example of FIG. 11, high voltages in the approximate range of 5-9V, e.g., approximately 6.6V, is applied to control gate 208. A high voltage in the approximate range of 1-2.5V, e.g., approximately 1.6V, is applied to diffusion region 214. Diffusion region 212 can be tied to a low voltage of approximately 0V. Again, the voltages illustrated in FIG. 11 are by way of example only and it will be understood that the actual voltages used would depend on the requirements of the specific implementation.

Figure 12:
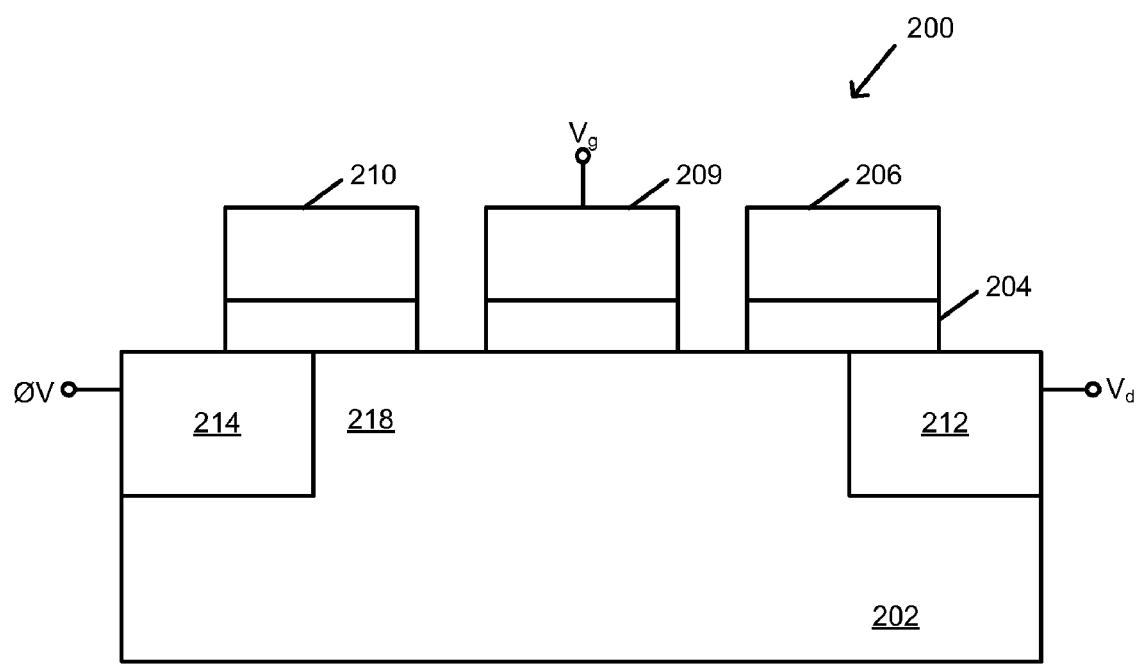
FIG. 12 is a diagram illustrating an example reverse read operation for reading the second bit of the device of FIG. 2 in accordance with one embodiment.

Similarly, FIG. 12 is a diagram illustrating an example reverse read operation for reading the floating gate 210 of device 200 in accordance with one embodiment. Here, the voltages applied to diffusion regions 212 and 214 are reversed, so that the bit stored on the left side of device 200 can be read.

In the example of FIG. 12, high voltages in the approximate range of 5-9V, e.g., approximately 6.6V, is applied to control gate 208. A high voltage in the approximate range of 1-2.5V, e.g., approximately 1.6V, is applied to diffusion region 212. Diffusion region 214 can be tied to a low voltage of approximately 0V. Again, the voltages illustrated in FIG. 12 are by way of example only and it will be understood that the actual voltages used would depend on the requirements of the specific implementation.

Figure 13:
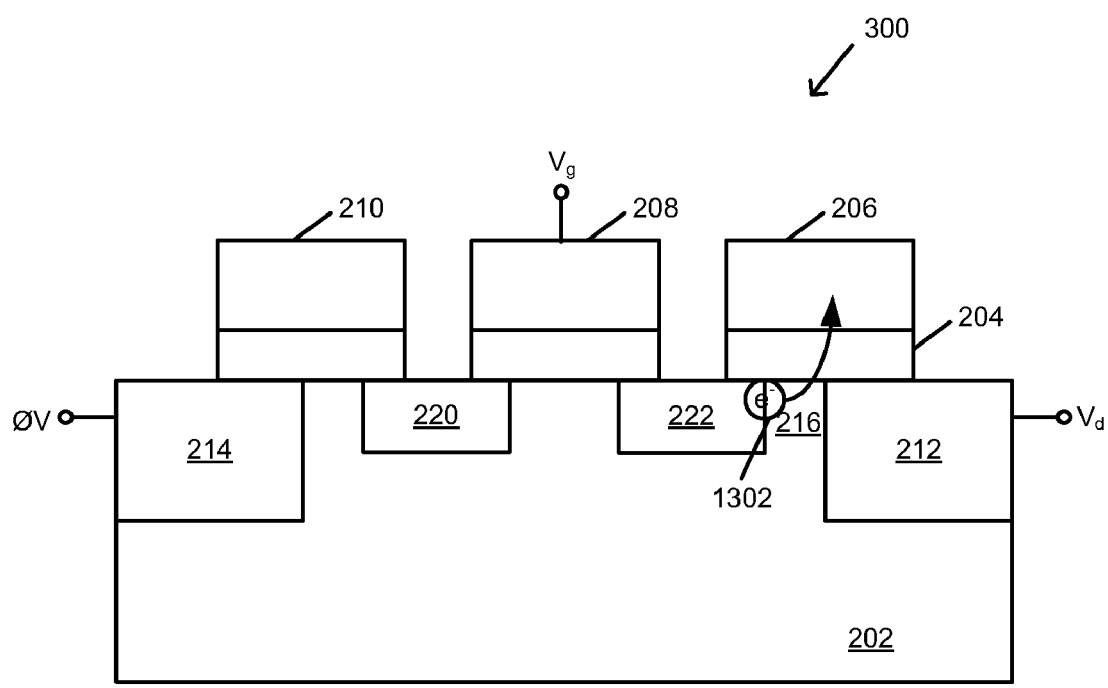
FIG. 13 is a diagram illustrating an example method for programming the first bit of the device of FIG. 3 in accordance with one embodiment.

FIG. 13 is a diagram illustrating an example program operation for device 300 in accordance with one embodiment. As with the example of FIG. 6, CHE injection is used to program the first bit of device 300. Device 300 can be seen as comprising three parts, one storage devices formed from floating gate 210 and diffusion regions 214 and 220, an access transistor formed from control gate 208 and diffusion regions 220 and 222, and a second storage device formed from floating gate 206 and diffusion regions 222 and 212. In order for current to flow in channel region 216 so that floating gate 206 can be programmed, the access transistor must be on.

Accordingly, a high voltage can first be applied to control gate 208. The voltage supplied to control gate 208 will turn on the access transistor comprising control gate 208. Voltages can also be applied to diffusion regions 212 and 214 in order to create a large lateral electric field across the channel region. In this case, a low voltage is applied to diffusion region 214, while a high voltage is applied to diffusion region 212. The high voltage applied to diffusion region 212 is also coupled with floating gate 206 as described above.

The high voltages coupled with floating gate 206 must be sufficient to allow an inversion channel region 216 to form under floating gate 206 into which carriers, in this case electrons 1302, can be induced by the large lateral electric field and caused to flow in channel 216 from diffusion region 222 toward diffusion region 212. The voltage coupled with floating gate 206 must also be sufficient to cause at least some of the carriers 1302 to inject through dielectric layer 204 into floating gate 206. The injected carriers will then be stored in floating gate 206, which will change the threshold voltage ($V_T$), and therefore the programming state of floating gate 206.

It will be understood, that carrier 1302 must have sufficient energy to overcome the barrier height of dielectric layer 204. For example, if dielectric layer 204 is a silicon dioxide dielectric layer, then carrier 1302 must have energy exceeding 3.2 eV in order to overcome the barrier height of the silicon dioxide layer 204.

In the example of FIG. 13, a high voltage of approximately 10V is applied to control gate 208, and a high voltage of approximately 5V is applied to diffusion region 212, while diffusion region 214 is tied to approximately 0V. It will be understood that the voltages illustrated are by way of example only and that the actual voltages will depend on the requirements of the specific implementation. For example, in certain embodiments, the voltage applied to control gate 208 can be in the approximate range of 8-12 V, and the voltage applied to diffusion region 212 can be in the approximate range of 4-6V.

Figure 14:
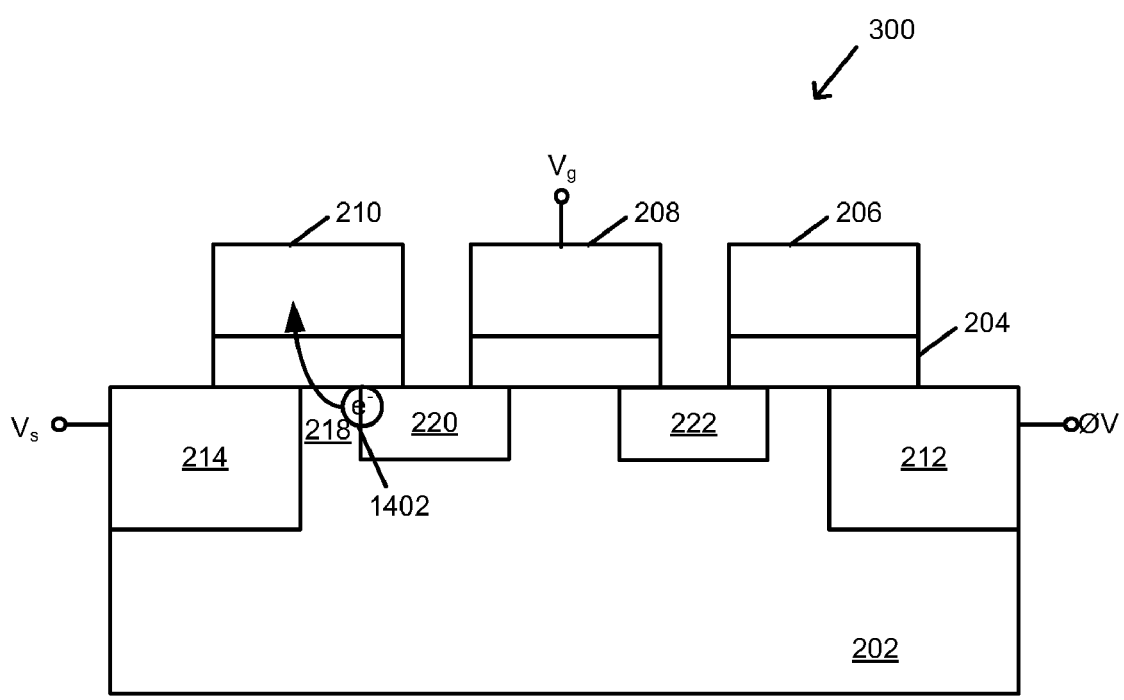
FIG. 14 is a diagram illustrating an example process for programming the second bit of the device of FIG. 3 in accordance with one embodiment.

FIG. 14 is a diagram illustrating an example CHE process for programming floating gate 210 of device 300 in accordance with one embodiment. Here, the lateral electric field must be reversed so that carriers 1402 travel from diffusion region 220 toward diffusion region 214 in channel 218, which is created under floating gate 210 due to coupling of the voltages applied to control gate 208 and diffusion region 214 with floating gate 210. The voltages coupled with floating gate 210 must also be sufficient to cause at least some of carriers 1402 to inject through dielectric layer 204 into floating gate 210.

In the example of FIG. 14, a high voltage of approximately 10V is applied to control gate 208, and a high voltage of approximately 5V is applied to diffusion region 214, while diffusion region 212 is tied to approximately 0V. It will be understood that the voltages illustrated are by way of example only and that the actual voltages will depend on the requirements of the specific implementation. For example, in certain embodiments, the voltage applied to control gate 208 can be in the approximate range of 8-12 V, and the voltage applied to diffusion region 214 can be in the approximate range of 4-6V.

Figure 15:
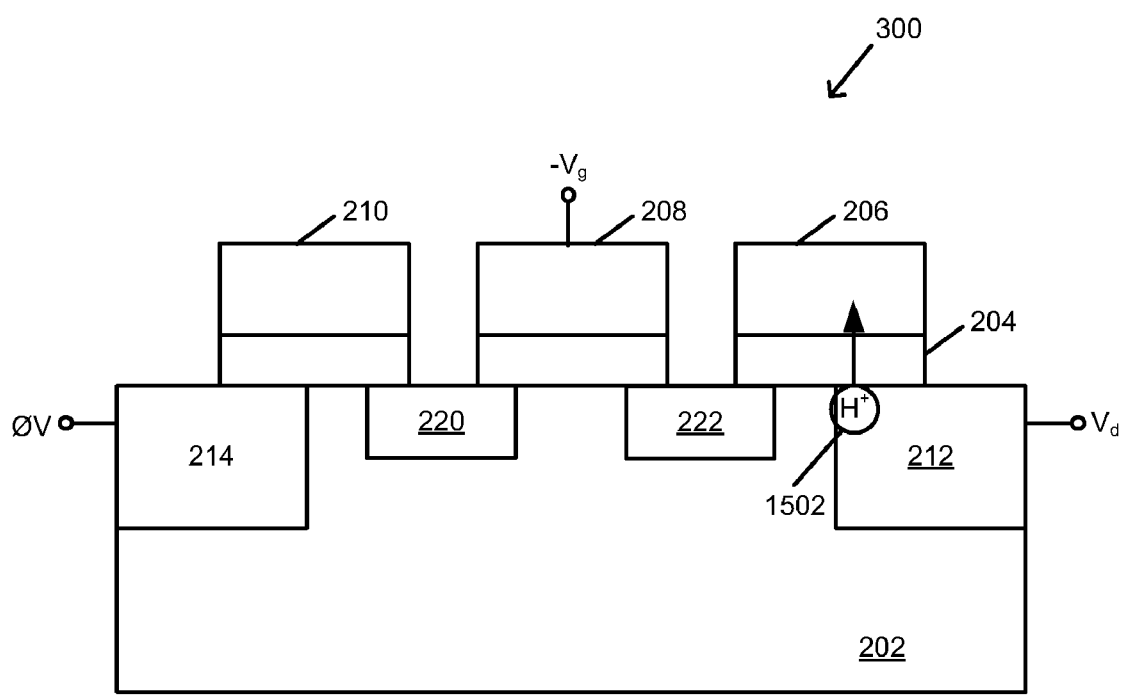
FIG. 15 is a diagram illustrating an example erase operation for the first bit of the device of FIG. 3 in accordance with one embodiment.

FIG. 15 is a diagram illustrating an example method for BTBHH erasing of the first bit of device 300 in accordance with one embodiment. As can be seen in FIG. 15, a large negative voltage is applied to control gate 208. The large negative voltage will be coupled with floating gate 206, negatively biasing floating gate 206. A high voltage is then applied to diffusion region 212. Diffusion region 214 is held at a low voltage, i.e., 0 V, to prevent BTBHH erasing of floating gate 210.

Under the conditions illustrated in FIG. 15, a significant portion of N+ diffusion region 212 under floating gate 206 and near channel region 216 will be deleted of electrons. When the electric field across dielectric layer 204 becomes sufficiently large, holes 1502 can inject through oxide layer 204 into floating gate 206, where they will compensate for any electrons stored in floating gate 206.

It will be understood that the voltages illustrated in FIG. 15 are by way of example only and that the actual voltages will depend on the requirements of the specific implementation. For example, in certain embodiments, the voltage applied to control gate 208 can be in the approximate range of (−15)-(−25) V, and the voltage applied to diffusion region 212 can be in the approximate range of 4-6V.

Figure 16:
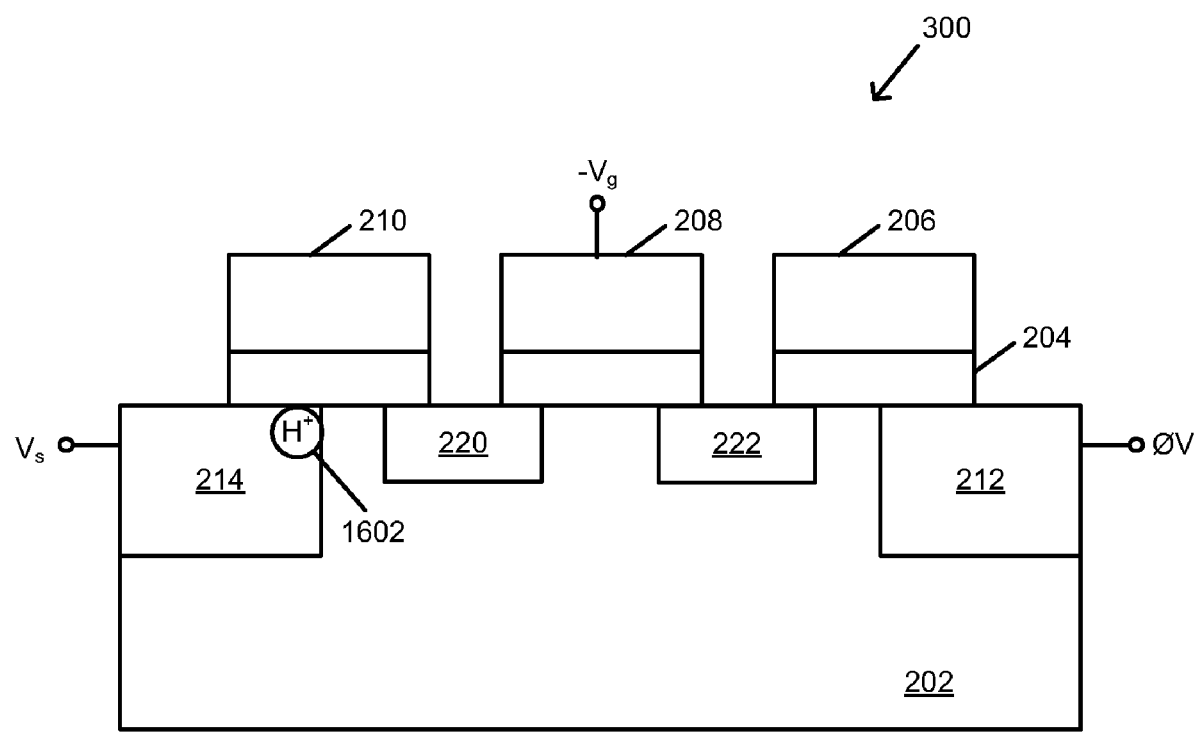
FIG. 16 is a diagram illustrating the erase operation and example erase operation for the second bit of the device of FIG. 3 in accordance with one embodiment.

FIG. 16 is a diagram illustrating BTBHH process for erasing the second bit of device 300 in accordance with one embodiment. Accordingly, a large negative voltage, e.g., −20V, is applied to control gate 208 in order to negatively bias floating gate 210. In this case, diffusion region 214 is biased with a positive voltage, e.g., 5V, while diffusion region 212 is tied to a low voltage, i.e., 0V, to avoid BTBHH erasure of floating gate 206. The electric field created across dielectric layer 204 by the bias applied to floating gate 210 and diffusion region 214 will deplete a portion of diffusion region 214 of electrons and start BTBHH injection of the resulting minority carriers 1602 across dielectric layer 204 into floating gate 210, where they will compensate for electrons previously stored in floating gate 210.

Again it will be understood that the voltages illustrated in FIG. 16 are by way of example only and that the actual voltages will depend on the requirements of the specific implementation. For example, in certain embodiments, the voltage applied to control gate 208 can be in the approximate range of (−15)-(−25) V, and the voltage applied to diffusion region 214 can be in the approximate range of 4-6V.

Figure 17:
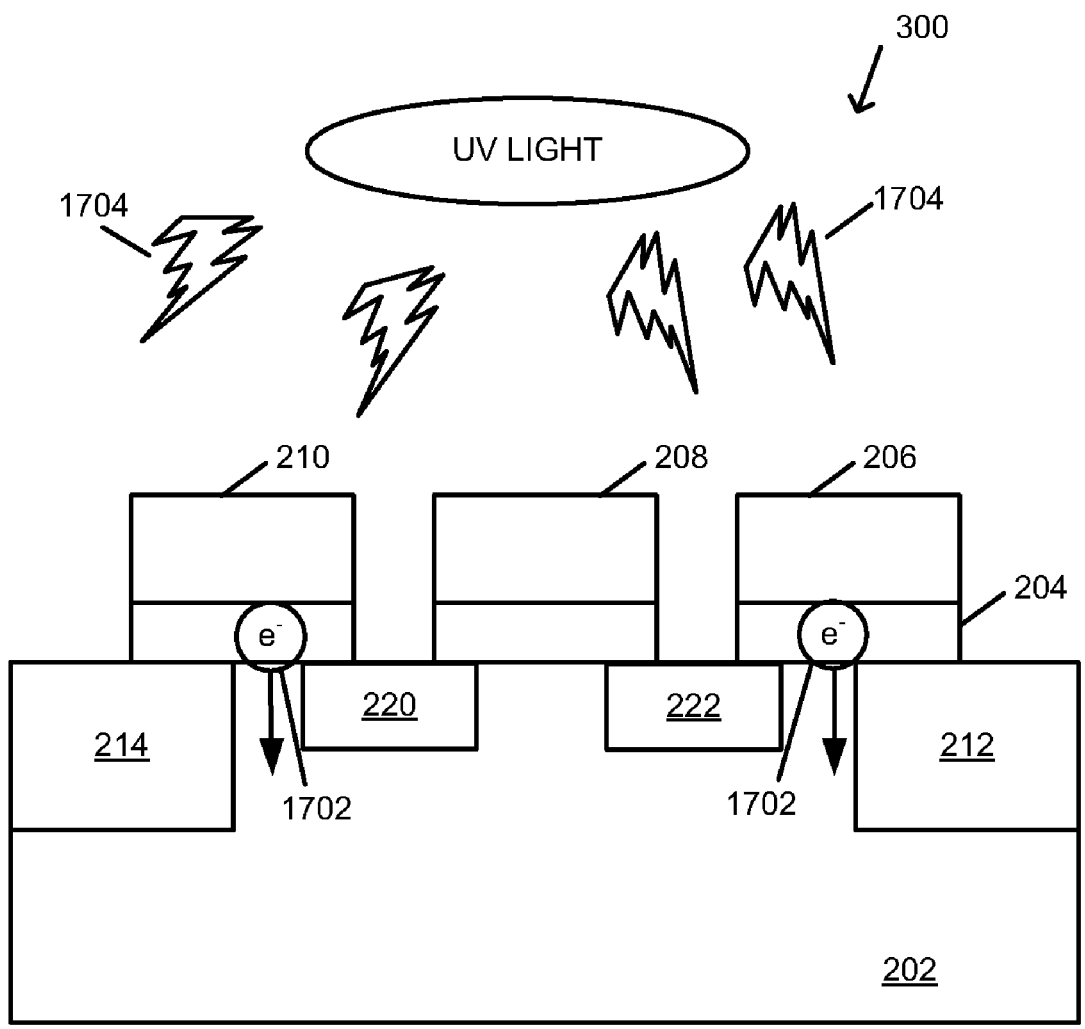
FIG. 17 is a diagram illustrating an example erase operation for erasing both bits of the device of FIG. 3 in accordance with one embodiment.

FIG. 17 is a diagram illustrating an example erase operation for device 300 in accordance with one embodiment. In the example of FIG. 17, ultraviolet (UV) radiation 1704 is incident on device 300. The energy from radiation 1704 will provide electrons 1702 with sufficient energy to penetrate dielectric layer 204 and escape back into substrate 202.

Figure 18:
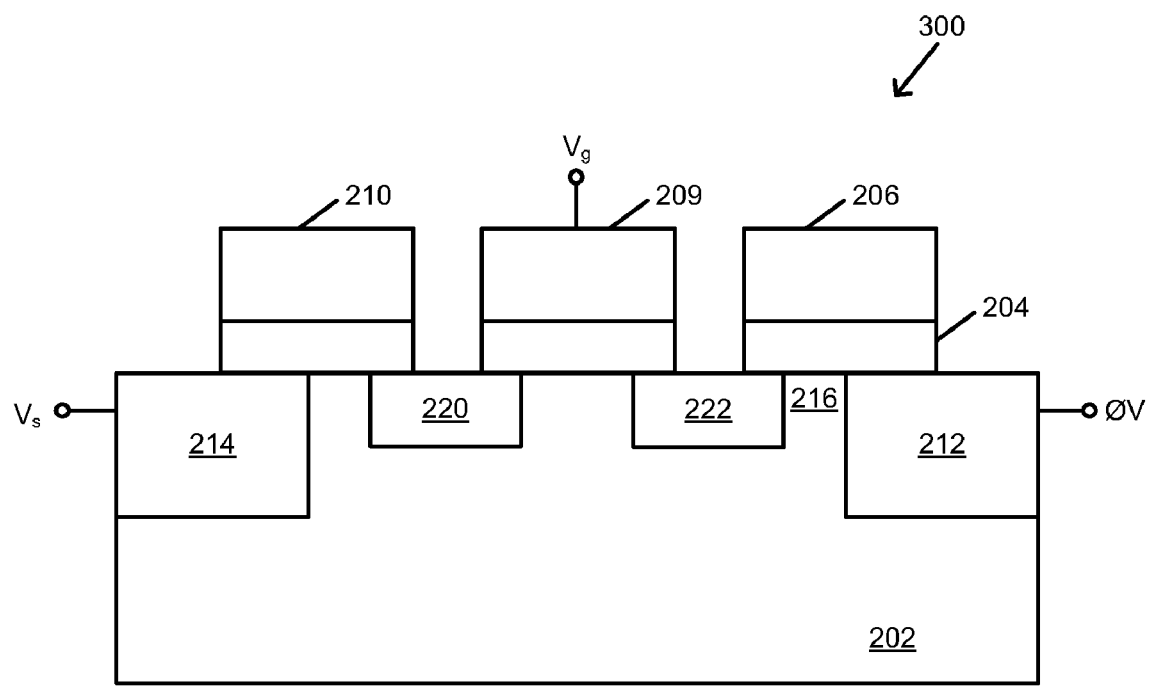
FIG. 18 is a diagram illustrating an example reverse read operation for reading the first bit of the device of FIG. 3 in accordance with one embodiment.

FIG. 18 is a diagram illustrating an example reverse read operation for reading the floating gate 206 of device 300 in accordance with one embodiment. First, a high voltage must be applied to control gate 208. A high voltage can also be applied to diffusion region 214, while a low voltage is applied to diffusion region 212. The high voltage applied to control gate 208 will cause the access transistor comprising control gate 208 to turn on.

In the example of FIG. 18, high voltages in the approximate range of 5-9V, e.g., approximately 6.6V, is applied to control gate 208. A high voltage in the approximate range of 1-2.5V, e.g., approximately 1.6V, is applied to diffusion region 214. Diffusion region 212 can be tied to a low voltage of approximately 0V. Again, the voltages illustrated in FIG. 18 are by way of example only and it will be understood that the actual voltages used would depend on the requirements of the specific implementation.

Figure 19:
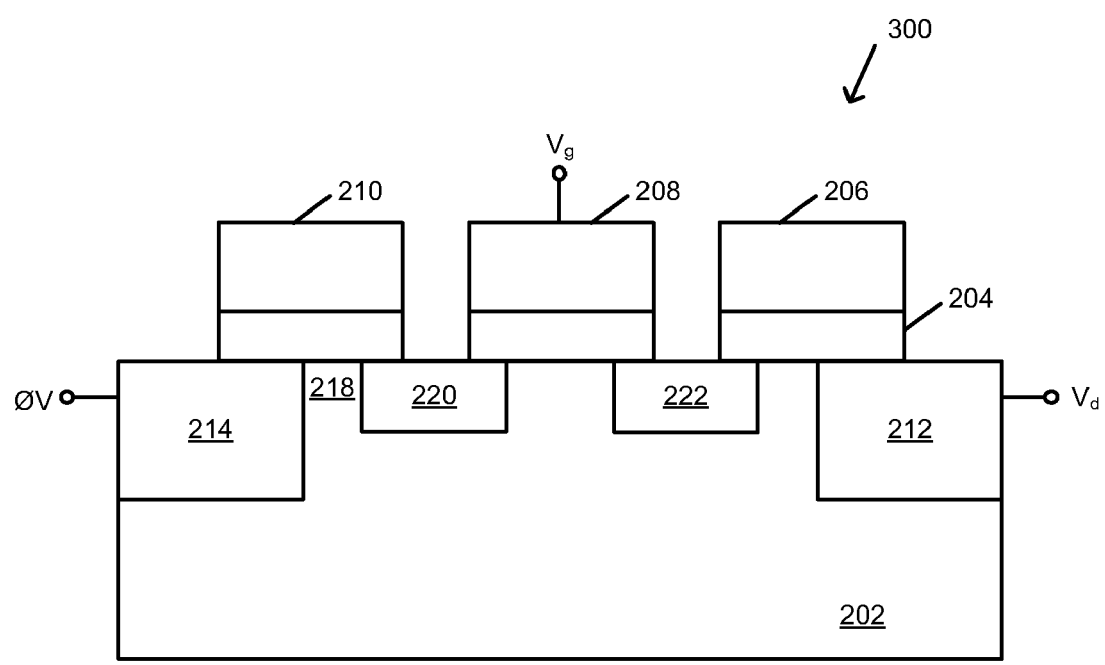
FIG. 19 is a diagram illustrating an example reverse read operation for reading the second bit of the device of FIG. 3 in accordance with one embodiment.

Similarly, FIG. 19 is a diagram illustrating an example reverse read operation for reading the floating gate 210 of device 300 in accordance with one embodiment. Here, the voltages applied to diffusion regions 212 and 214 are reversed, so that the bit stored on the left side of device 300 can be read.

In the example of FIG. 19, high voltages in the approximate range of 5-9V, e.g., approximately 6.6V, is applied to control gate 208. A high voltage in the approximate range of 1-2.5V, e.g., approximately 1.6V, is applied to diffusion region 212. Diffusion region 214 can be tied to a low voltage of approximately 0V. Again, the voltages illustrated in FIG. 19 are by way of example only and it will be understood that the actual voltages used would depend on the requirements of the specific implementation.

Accordingly, the non-volatile memory devices described above, and the methods associated therewith, can provide higher densities, lower cost, and decrease power consumption. Further, the devices described above are compatible with conventional single poly fabrication processes, which can further reduce costs and increase throughput.

Figure 20:
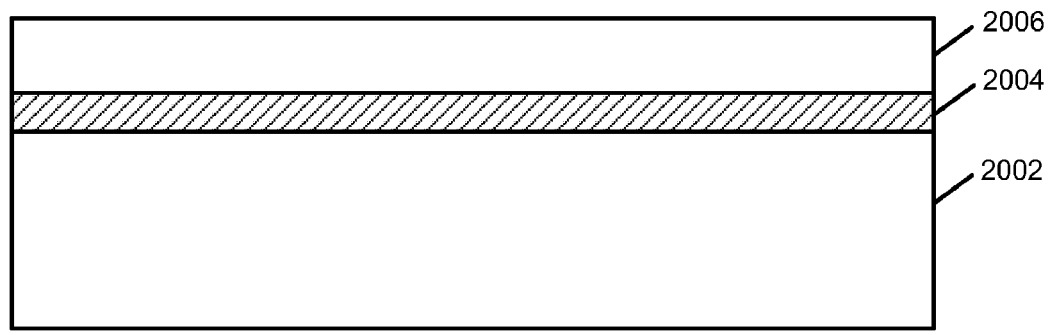
FIGS. 20-24 are cross sectional, schematic view illustrating the progression of steps for manufacturing the devices of FIGS. 2 and 3 in accordance with one embodiment.

FIGS. 20-24 are cross-sectional schematic views of the progression of certain process steps for manufacturing a non-volatile memory device, such as device 200, configured in accordance with the embodiments described herein. First, as illustrated in FIG. 20, the process can start with a silicon substrate 2002. In the example of FIG. 20, substrate 2002 is a P-type silicon substrate; however, it will be understood that N-type silicon substrates can also be used in accordance with the embodiments described herein.

A gate dielectric layer 2004 is then formed on substrate 2002. For example, gate dielectric layer 2004 can be a silicon dioxide ($SiO_2$) layer. Gate dielectric layer 2004 can be deposited via chemical vapor deposition (CVD) in particular, a high-density plasma (HDP) CVD process can be used to deposit gate dielectric layer 2004.

Polysilicon layer to 2006 is then deposited over gate dielectric layer 2004. Polysilicon layer 2006 can also be deposited via CVD process.

Figure 21:
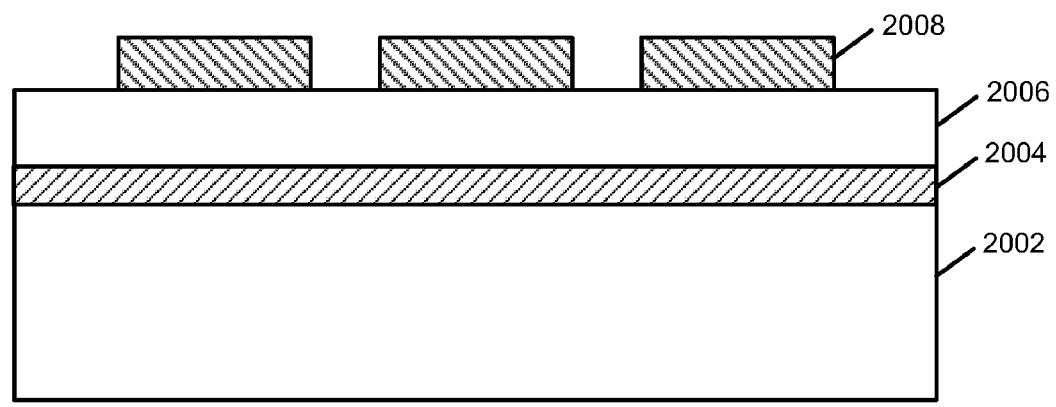

As illustrated in FIG. 21, polysilicon layer 2006 is then patterned via a photo resist mask formed from photo resist layer 2008, which is applied over polysilicon layer 2006. Photo resist layer 2008 can be applied and patterned, or defined using conventional photo lithography techniques.

Figure 22:
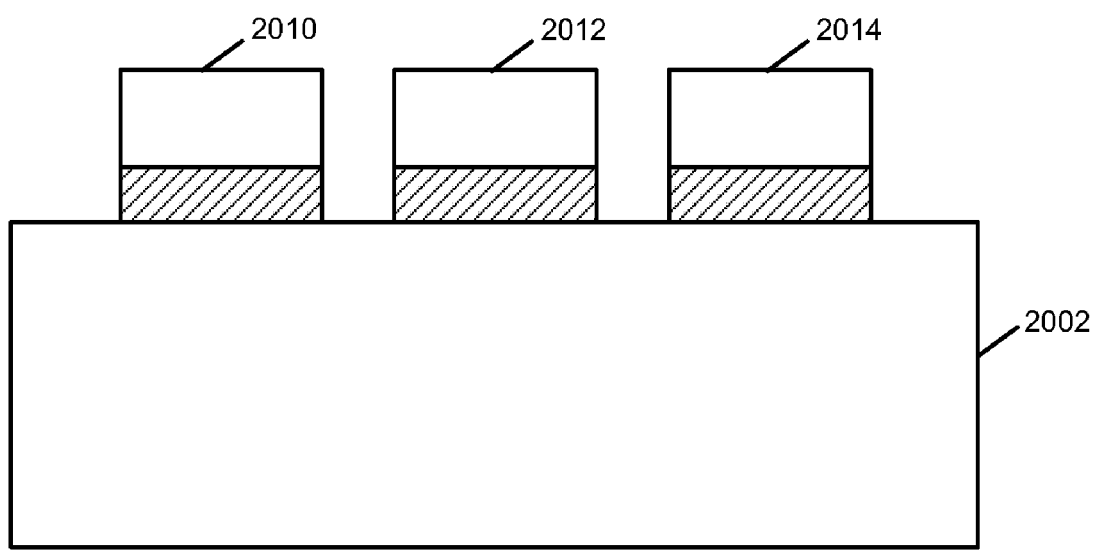

As illustrated in FIG. 22, once photo resist layer 2008 is defined as illustrated in FIG. 21, polysilicon layer 2006 and gate dielectric layer 2004 can be etched in order to form gate structures 2010, 2012 and 2014. Because straight walls are required for gate structures 2010, 2012, 2014, an anisotropic etching process is preferably used to etch polysilicon layer 2006 and gate dielectric layer 2004. The defined photo resist 2008 can then be removed, e.g., using plasma ashing.

Figure 23:
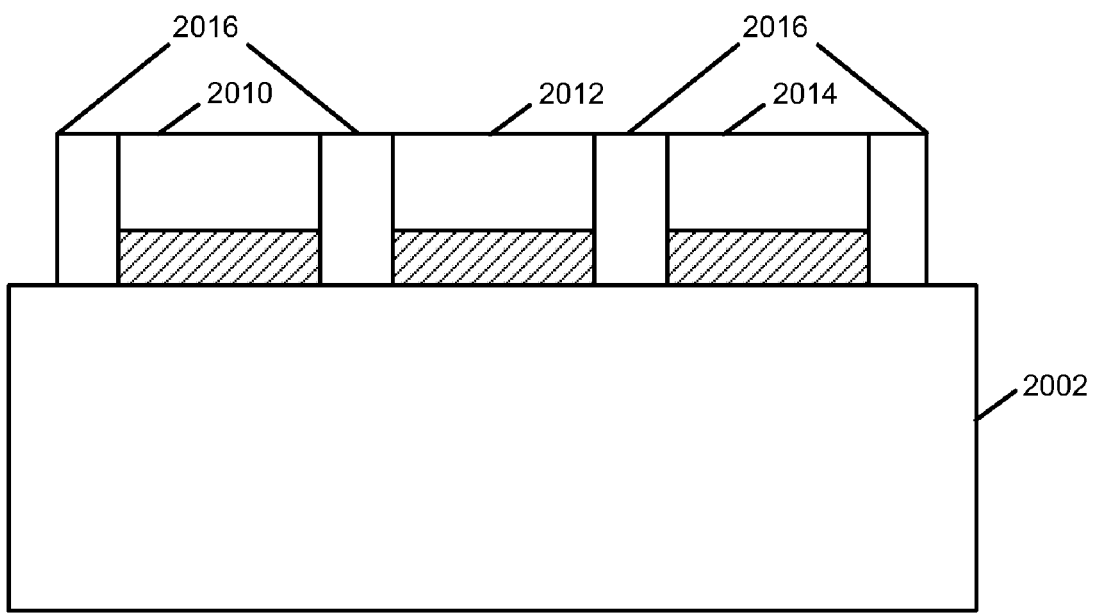

As illustrated in FIG. 23, oxide spacers 2016 can then be formed on the sides of gate structures 2010, 2012, and 2014. Oxide spacers 2016 can be formed, for example, by depositing an oxide layer over substrate 2002 and then, removing, e.g., etching, the unwanted portions of the oxide layer.

Figure 24:
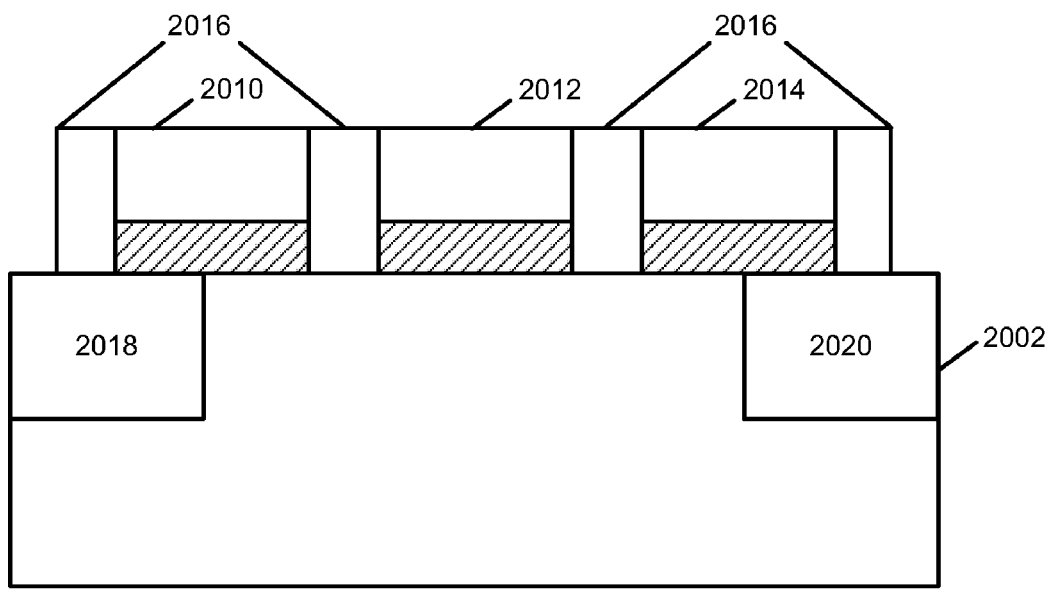

As illustrated in FIG. 24, the diffusion regions 2018 and 2020 can then be formed in substrate 2002.

Figure 25:
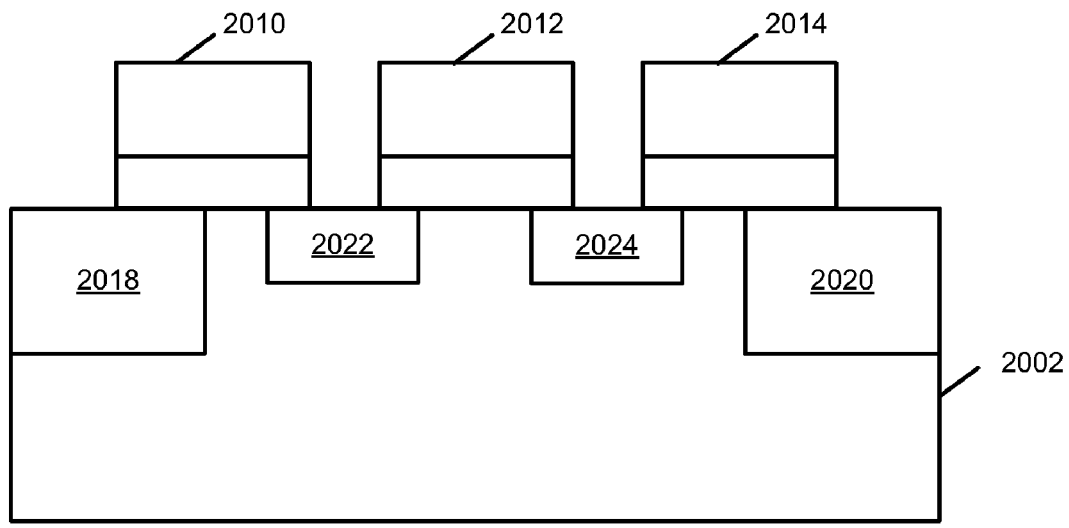
FIG. 25 is a cross sectional, schematic view illustrating a step for manufacturing the device of FIG. 3 in accordance with one embodiment.

FIG. 25 is a diagram illustrating a process step for manufacturing device 300 that is unique to device 300. Accordingly, process steps for manufacturing device 300 can proceed as with the process steps described above for device 200 in FIGS. 20-22; however, as illustrated in FIG. 25, once a gate structures 2010, 2012 and 2014 are formed, implantation of diffusion regions 2018, 2020, 2022 and 2024 can take place. Once diffusion regions 2018, 2020, 2022 and 2024 are implanted in substrate 2002, then oxide spacers 2016 can be formed as illustrated in FIG. 23.

It will be understood that the steps described above do not represent all of the steps necessary to manufacture a non-volatile memory device as described herein. It will be understood that other pre and post processing steps, such as cleaning steps, polishing steps, the formation of polysilicon and/or metal interconnect layers, etc. may need to performed. Accordingly, it will be understood that the steps described above are steps that are unique to the manufacture of non-volatile memory devices as described herein and not intended to be a comprehensive listing of the steps require dot produce such a device.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A non-volatile memory device, comprising:
a substrate;
a dielectric layer formed on the substrate;
a control gate formed on the dielectric layer;
a first floating gate formed on the dielectric layer on one side of the control gate;
a second floating gate formed on the dielectric layer on the other side of the control gate;
a source region formed in the substrate near the first floating gate;
a drain region formed in the substrate near the second floating gate;
a first diffusion region formed in the substrate between the first floating gate and the control gate, and spaced apart from the source and drain regions; a second diffusion region formed in the substrate near the second floating gate and the control gate; and
wherein there is no other source region or drain region between the source region and the drain region.

2. The non-volatile memory device of claim 1, wherein the substrate is a p-type substrate.

3. The non-volatile memory device of claim 1, wherein the substrate is a n-type substrate.

4. The non-volatile memory device of claim 1, wherein the first and second floating gates and the control gate are fabricated using a single poly process.

5. The non-volatile memory device of claim 1, wherein the control gate and the source region are configured to couple voltages applied to the control gate and the source region with the first floating gate.

6. The non-volatile memory device of claim 5, wherein the capacitance between the control gate and the first floating gate is the dielectric constant ($\in$) of the dielectric layer multiplied by the height of the control gate, multiplied by the width of the control gate, and then divided by the spacing between control gate and floating gate.

7. The non-volatile memory device of claim 6, wherein the height of the control gate is approximately 800~1500 Å.

8. The non-volatile memory device of claim 6, wherein the space between the control gate and the first floating gate is approximately 160~300 Å.

9. The non-volatile memory device of claim 1, wherein the capacitance between the first floating gate and the first diffusion region is the dielectric constant ($\in$) of the dielectric layer multiplied by the length of the dielectric layer under the first floating gate and above the source region, multiplied by the width of the first floating gate, and then divided by the thickness of the dielectric layer.

10. The non-volatile memory device of claim 9, wherein the length of the dielectric layer under the first floating gate and above the source region is approximately 100~300 Å.

11. The non-volatile memory device of claim 9, wherein the thickness of the dielectric layer is approximately 50~250 Å.

12. The non-volatile memory device of claim 1, wherein the control gate and the drain region are configured to couple voltages applied to the control gate and the drain region with the second floating gate.

13. The non-volatile memory device of claim 12, wherein the capacitance between the control gate and the second floating gate is the dielectric constant ($\in$) of the dielectric layer multiplied by the height of the control gate, multiplied by the width of the control gate, and then divided by the spacing between control gate and floating gate.

14. The non-volatile memory device of claim 13, wherein the height of the control gate is approximately 800~1500 Å.

15. The non-volatile memory device of claim 13, wherein the space between the control gate and the second floating gate is approximately 160~300 Å.

16. The non-volatile memory device of claim 1, wherein the capacitance between the second floating gate and the drain region is the dielectric constant ($\in$) of the dielectric layer multiplied by the length of the dielectric layer under the second floating gate and above the drain region, multiplied by the width of the second floating gate, and then divided by the thickness of the dielectric layer.

17. The non-volatile memory device of claim 16, wherein the length of the dielectric layer under the second floating gate and above the drain region is approximately 100~300 Å.

18. The non-volatile memory device of claim 16, wherein the thickness of the dielectric layer is approximately 50~250 Å.

19. The non-volatile memory device of claim 1, wherein the device is configured to store two bits of information.

20. The non-volatile memory device of claim 1, wherein the second diffusion region is spaced apart from the source and drain regions.

21. The non-volatile memory device of claim 20, wherein the second diffusion region is spaced apart from the first diffusion region.

22. The non-volatile memory device of claim 1, wherein the first and second floating gates and the control gate are between the source and drain regions of a single memory cell.

23. A method for manufacturing a non-volatile memory device, comprising:
   forming a control gate structure on a substrate;
   forming a first floating gate structure on the substrate on one side of the control gate structure;
   forming a second floating gate structure on the substrate on the other side of the control gate structure;
   forming a source region in the substrate near the first floating gate structure;
   forming a drain region in the substrate near the second floating gate structure; and
   forming a first diffusion region in the substrate between the first floating gate structure and the control gate structure, and spaced apart from the source and drain regions; forming a second diffusion region in the substrate near the second floating gate structure and the control gate structure; and
   wherein no other source region or drain region is formed between the source region and the drain region.

24. The method of claim 23, wherein forming the first floating gate structure, the second floating gate structure, and the control gate structure comprises:
   depositing a dielectric layer on the substrate;
   depositing a polysilicon layer on the dielectric layer;
   defining the polysilicon layer using a photoresist layer; and
   etching the defined polysilicon layer and the dielectric layer.

25. The method of claim 24, wherein the dielectric layer and polysilicon layer are deposited using chemical vapor deposition.

26. The method of claim 25, wherein the dielectric layer is deposited using high density plasma chemical vapor deposition.

27. The method of claim 23, further comprising forming oxide spacers between the gate structures.

28. The method of claim 23, wherein the second diffusion region is spaced apart from the source and drain regions.

29. The method of claim 28, wherein the second diffusion region is spaced apart from the first diffusion region.

* * * * *